United States Patent [19]

Dyer et al.

[11] Patent Number: 5,273,775
[45] Date of Patent: Dec. 28, 1993

[54] PROCESS FOR SELECTIVELY DEPOSITING COPPER ALUMINUM ALLOY ONTO A SUBSTRATE

[75] Inventors: Paul N. Dyer, Allentown; Stephen M. Fine, Emmaus, both of Pa.; John A. T. Norman, Encinitas, Calif.

[73] Assignee: Air Products and Chemicals, Inc., Allentown, Pa.

[21] Appl. No.: 867,599

[22] Filed: Apr. 13, 1992

Related U.S. Application Data

[63] Continuation-in-part of Ser. No. 581,609, Sep. 12, 1990, abandoned.

[51] Int. Cl.$^5$ .............................................. C23C 16/00
[52] U.S. Cl. ...................................... 427/99; 427/252; 427/253; 427/255; 427/255.7; 156/662
[58] Field of Search ................ 427/96, 99, 252, 253, 427/255, 255.7; 156/662

[56] References Cited

U.S. PATENT DOCUMENTS

| | | | |
|---|---|---|---|
| 3,206,326 | 9/1965 | Whaley et al. | 427/252 |
| 3,462,288 | 8/1969 | Schmidt et al. | 427/35 |
| 3,753,768 | 8/1973 | Ichiki | 427/253 |
| 4,923,717 | 5/1990 | Gladfelter | 427/255.7 |
| 4,948,623 | 8/1990 | Beach et al. | 427/35 |
| 4,956,204 | 9/1990 | Amazawa | 427/255 |
| 5,085,731 | 2/1992 | Norman | 427/252 |
| 5,098,516 | 3/1992 | Norman | 427/252 |

FOREIGN PATENT DOCUMENTS

| | | | |
|---|---|---|---|
| 719231 | 10/1965 | Canada | 427/252 |
| 2195663 | 4/1988 | United Kingdom | 427/253 |

OTHER PUBLICATIONS

C. Y. Ting "TiN formed by evaporation as a diffusion barrier between Al and Si" J. Vac. Sci Technol. 21(1) May/Jun. 1982, pp. 14–18.
D. Pramanik, et al. "VLSI Metallization Using Aluminum and Its Alloys", Solid State Technology, 26, p. 127 (Jan. 1983).
G. S. Higashi, et al., "Mechanism of Surface Selectivity in Aluminum Chemical Vapor Deposition," J. Vac. Sci. Tech. p. 103, 8, Jan./Feb. 1990.
T. Amazawa, et al, "Selective Growth of Aluminum Using a Novel CVD System," IEDM 88–43, p. 442 (1988).
T. Shinzawa, et al, "Selective Al CVD Using Dimethyl Aluminum Hydride", IEEE-VLSI Multilevel Interconnection Conference, p. 123, (1990).
C. Sasaoka, et al, "Aluminum Selective Area Deposition on Si Using Diethylaluminumchloride", Appl. Phys. Letter, vol. 55, No. 8, (1989) p. 741.
L. Kwakman et al, "The Incorporation of Copper in CVD Aluminum By Diffusion from In-Situ Sputtered Sources", IEEE-VMIC Conference, p. 282, (1990).
K. P. Chung, et al., "Improved, CVD Aluminum Deposition Using In-Situ Sputtered Nucleration Layers," IEEE-VMIC Conference, p. 303, Jun. 1990.
T. H. Baum, et al, "Laser Induced Chemical Vapor Deposition of Aluminum", Appl. Phys. Lett., vol. 55, No. 12, Sep. 1989, p. 1264.
D. B. Beach, et al, "Chemical Vapor Deposition of Aluminum from Trimethylamine-alane", J. Vac. Sci. Technol. A7, 3117, Sep./Oct. 1989.

*Primary Examiner*—Shrive Beck
*Assistant Examiner*—Vi Duong Dang
*Attorney, Agent, or Firm*—Keith D. Gourley; James C. Simmons; William F. Marsh

[57] ABSTRACT

An improved method is provided for depositing a thin copper aluminum alloy film on a patterned silicon substrate. A copper base layer conforming to the existing pattern is initially formed on the surface of the substrate, followed by contact with vapors of an aminealane compound, which causes aluminum to be selectively deposited on the copper base layer portion of the substrate. Preferably, copper is applied to a diffusion barrier surface such as tungsten using chemical vapor deposition from a complex of copper (I) perfluoroalkyl-β-diketonate and an olefin or silylolefin. The entire process of developing an alloy film can be carried out without exceeding 200° C.

27 Claims, 2 Drawing Sheets

5,273,775

PROCESS FOR SELECTIVELY DEPOSITING COPPER ALUMINUM ALLOY ONTO A SUBSTRATE

CROSS-REFERENCE TO RELATED APPLICATIONS

This application is a continuation-in-part of copending application Ser. No. 07/581,609, filed Sep. 12, 1990, now abandoned, the Specification which is specifically incorporated by reference herein and made a part of this Application.

TECHNICAL FIELD OF THE INVENTION

The present invention relates to a chemical vapor deposition (CVD) process for selectively depositing thin films of high purity aluminum onto silicon substrates. In another aspect, the invention relates to a low temperature process for sequentially depositing copper and aluminum films required in the manufacture of electronic devices. In still another aspect, the invention relates to a process for fanning copper aluminum alloy interconnects in integrated circuits by CVD at relatively low temperatures.

BACKGROUND OF THE INVENTION

Figure 1A:
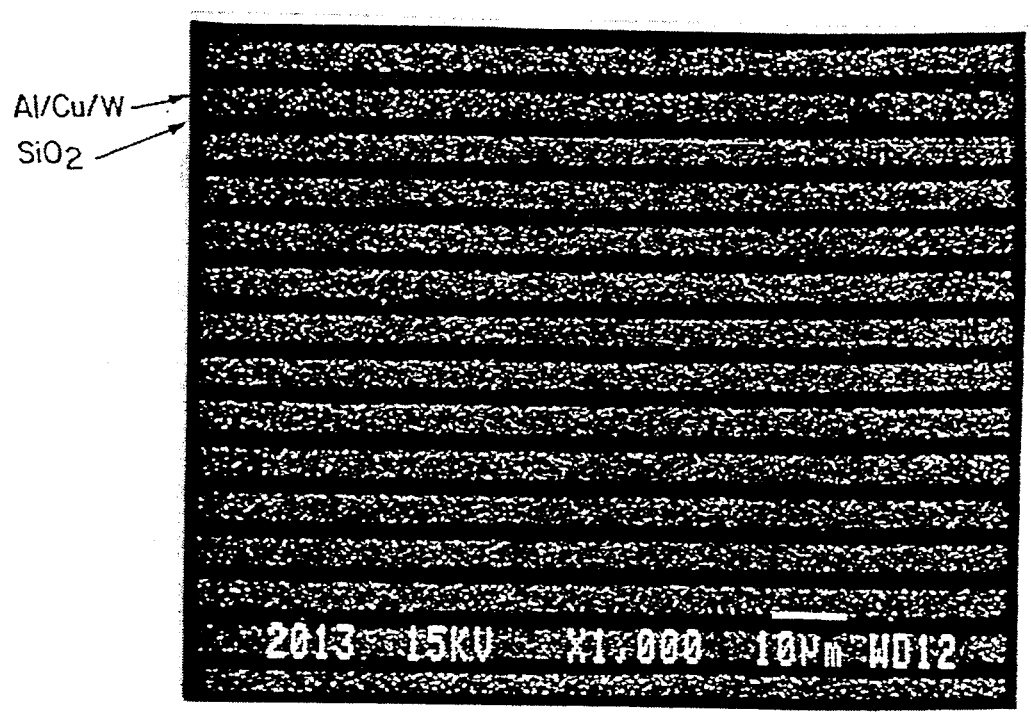
FIG. 1A illustrates a plane view scanning electron micrograph, presented in 1000× magnification, of a patterned tungsten fine line test circuit only which a layer of copper and aluminum has been selectively deposited.

Aluminum metallization is currently utilized in manufacturing very large scale integrated circuits (VLSI). The most common methods for depositing aluminum utilize magnetron sputtering or other physical vapor deposition (PVD) techniques. However, because physical vapor deposition techniques are "line-of-sight" techniques, adequate step coverage becomes difficult as integrated circuit features are reduced in size to a scale below 0.5 micrometers. In contrast to PVD techniques, CVD is an inherently conformal process which enables even very small features with large aspect ratios to be conformally coated. D. Pramanik and A. N. Saxena, *Solid State Technology*, 26, 127 (January 1983), present an interesting overview on using thin films in manufacturing integrated circuits.

A patterned CVD aluminum metallization can be accomplished in one of two ways. A blanket aluminum film can be deposited following by patterning and etching to form the desired aluminum pattern or a selective aluminum film can be deposited directly. The selective process is preferred because fewer processing steps are required.

To date, selective CVD aluminum metallization has been accomplished using alkylaluminum compounds such as triisobutylaluminum, dimethylaluminumhydride and diethylaluminumchloride. Unfortunately, selective CVD of aluminum onto silicon, aluminum, and titanium silicide surfaces using alkylaluminum compounds has been demonstrated only at temperatures greater than 230° C. Thus, temperature sensitive substrates can not be coated using this process. Additionally, alkyl-aluminum compounds are pyrophoric liquids and are therefore difficult to handle safely.

Higashi and coworkers and Amazawa and coworkers disclose a CVD process for selectively depositing aluminum onto aluminum silicon and titanium silicide surfaces using triisobutylaluminum, (Ref. Higashi, et al. *J. Voc. Sci. Technol.*, 8 (1990); Amazawa, et al. IEDM-88, 442 (1988) and Shinzawa, et al. *IEEE-VLSI Multilevel Interconnection Conference*, p123 (1990) demonstrated selective deposition using dimethylaluminumhydride. Sasaoka, et al. *Appl. Phys. Lett.* 55, 741 (1989), using diethylaluminumchloride, disclose selective deposition onto silicon. Selective deposition occurred at temperatures greater than 230° C. when the precursor was an alkylaluminum compound.

Kwakman, et al. *IEEE-VMIC Conference*, 282 (1990) and Cheung, et al. *IEEE-VMIC Conference*, 303 (1990) describe a CVD process for depositing aluminum using triisobutylaluminum. The investigators report that metal seed layers (copper, titanium or titanium nitride) enhance the growth of CVD aluminum deposition at temperatures of 250° C. Titanium tetrachloride pretreatment was not required if a metal seed layer was first deposited by PVD. A much finer grain film was achieved than is usual in cases where triisobutylaluminum is used without titanium tetrachloride pretreatment. The paper does not teach or suggest a selective deposition process wherein metal seed layers are used with a precursor other than triisobutylaluminum nor depositions conducted at temperatures below 230° C.

The CVD of aluminum from base adducts of alane (e.g. trimethylaminealane) has been described in a number of papers and patents; for example, T. H. Baum, et al. *Appl. Phys. Lett.*, 55 1264 (1989) and D. B. Beach, et al. *J. Vac. Sci. Technol.* A7 3117 (1989), as well as U.S. Pat. Nos. 3,206,326 and 3,462,288. All of these prior processes using trimethylaminealane for the CVD of aluminum result in only blanket deposition, and processes for low temperature (<125° C.) blanket CVD require a highly corrosive activating agent such as $TiCl_4$. An aluminum coating could not be deposited onto the substrate at low temperatures in the absence of pretreating the substrate with titanium tetrachloride.

U.S. Pat. No. 4,948,623 discloses a process for depositing Cu and group IB metals such as silver and gold. The process comprises decomposing onto a substrate a vapor of a precursor comprising a cyclopentadienyl ring, a 2 electron donor ligand selected from the group consisting of trivalent phosphines, amines and arsines and the group IB metal which is present in the precursor in a +1 oxidation state.

BRIEF SUMMARY OF THE INVENTION

The present invention is a process for selectively depositing a high purity thin aluminum film onto a patterned silicon substrate formed by coating a silicon substrate with an oxide layer and subsequently etching away a portion of the oxide layer to form a pattern of exposed silicon. A copper base layer, conforming to the previously existing pattern, is deposited on the surface of the silicon substrate by conventional methods such as chemical vapor deposition (CVD) or physical vapor deposition (PVD). The substrate is subsequently contacted with vapors of an aminealane compound at a temperature from 25° to 180° C. to selectively deposit aluminum onto the patterned copper base layer portion of the substrate.

This process allows an aluminum film to be selectively deposited onto the copper surface of the substrate at temperatures lower than previously taught in the art and without using a corrosive activating agent such as titanium tetrachloride. Additionally, the deposited aluminum layer exhibits small grain size which is generally desirable in such operations.

In an improved aspect of our invention, a copper aluminum alloy film is developed on a metallic or other electrically conducting substrate surface by sequential CVD operations at relatively low temperatures. The substrate onto which the alloy is selectively applied is normally a patterned diffusion barrier on a dielectric support. In the first step, copper deposits are laid down by CVD using a copper (I) perfluoroalkyl-$\beta$-diketonate complexed with a suitable ligand such as an olefin or a silylolefin using temperatures at or below 200° C. In the second step, aluminum is deposited by contacting the copper layer with a base adduct of alane under CVD conditions at a temperature ranging from 25° to 180° C. During or subsequent to depositing the aluminum layer, the copper and aluminum layers are subjected to temperatures which cause copper to migrate into the aluminum thereby forming the desired homogeneous alloy.

DETAILED DESCRIPTION OF THE INVENTION

We have found that aluminum can be selectively deposited on a patterned substrate by using vapors of a base adduct of alane, specifically an aminealane, at low temperatures; i.e. from 25° to 180° C. The patterned substrate is formed by initially coating a silicon substrate with an oxide layer. The oxide layer is then etched to form the desired pattern of exposed silicon. Optionally, a diffusion barrier coating is applied to the exposed silicon portion of the substrate to hinder diffusion of the subsequently applied copper base layer into the substrate. Any suitable diffusion barrier layer which prevents the diffusion of the base layer into the substrate can be used, with preferred examples including Ti, TiN, Ta, TaN, W and combinations thereof.

A copper base layer is deposited on the substrate conforming to the previously existing substrate pattern. The copper base layer can be deposited conformally to the substrate pattern by any suitable technique known in the art including physical vapor deposition (PVD) or chemical vapor deposition (CVD). Copper is preferably deposited by CVD using one of the processes disclosed by U.S. Pat. No. 5,085,731, Norman et al. (1992) and U.S. Pat. No. 5,098,516, Norman et al. (1992), the disclosures of which are incorporated herein by reference.

Preferably the copper precursor is a complex of copper (I) perfluoroalkyl-$\beta$-diketonate with either an olefin or a silylolefin. Suitable CVD conditions include a temperature at or below 200° C. Copper can be deposited onto the surface of a metallic substrate or other electrically conducting substrate such as tungsten, titanium, molybdenum, titanium nitride, tantalum, tantalum nitride, titanium platinum, platinum silicide, tantalum silicide, and the like, including combinations of such materials. Such substrates are typically in the form of a patterned diffusion barrier on a silicon oxide or silicon/silicon oxide substrate.

As disclosed in the Norman et al. patents, the copper organometallic complex is activated by the metallic or other electrically conducting substrate at its surface so that metallic copper is deposited selectively onto this surface, presumably via a disproportionation mechanism. The organometallic copper (I)-$\beta$-diketonate is stabilized by the subject ligand such as an olefin or silylolefin ligand or the like. When a silylolefin is utilized, the silicon atom is connected to a carbon which is part of the olefinic double bond. An example of a preferred copper complex is $Cu^{+1}$ (hexafluoroacetylacetonate)$^{-1}$ • trimethylvinylsilane.

The organometallic copper complex can be represented by a structural formula as follows:

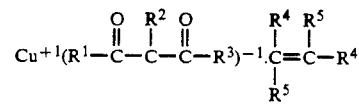

wherein
- $R^1$ and $R^3$ are each independently $C_1$ to $C_8$ perfluoroalkyl,
- $R^2$ is H, F or $C_1$ to $C_8$ perfluoroalkyl, each $R^4$ is independently H, $C_1$ to $C_8$ alkyl or $-Si(R^6)_3$,
- each $R^5$ is independently H, $C_1$ to $C_8$ alkyl or alkenyl or phenyl or both $R^5$ groups can be joined to form a cycloolefin, including diolefins and bicycloolefins, and
- each $R^6$ is independently phenyl or $C_1$ to $C_8$ alkyl, including both cis and trans isomers of this formula. Preferably, $R^1$ and $R^3$ are $CF_3$, $R^2$ is H, one $R^4$ is H and the other is $-Si(R^6)_3$ and each $R^5$ is H or $C_1$ to $C_8$ alkyl. In such a silylolefin complex, $R^6$ is preferably methyl.

Examples of suitable olefin ligands include ethylene, isobutylene, 1-octane, styrene, stilbene, 1,5-cyclooctadiene, norbornadiene, cyclooctene, 1,3-hexadiene, cyclopentene, 1-decene, 1,5,9-cyclododecatriene, 2,5-bicycloheptadiene, 1-octadecene, methylene cyclohexane, and the like. Examples of the silylolefin ligand are trimethylvinylsilane, diethylmethylvinylsilane, and the like.

The substrate is contacted with vapors of an aminealane compound, preferably an alkylaminealane such as trimethylaminealane, at a temperature ranging from 25° to 180° C., preferably 25° to 145° C., to cause selective deposition of aluminum on the patterned copper base layer portion of the substrate. Optionally, following the aluminum deposition step, the substrate may be subjected to an annealing step, such as rapid thermal annealing. Other suitable base adducts of alane include triethylaminealane, tetramethyl-ethylenediaminealane, trimethylphosphinealane, dimethylsulfidealane, and the like. The aminealanes are preferred.

The copper layer is deposited under CVD conditions which are known and described in the Norman, et al. patents. The temperature of the overall two step process does not exceed 200° C., thereby permitting temperature sensitive substrates, such as polymers, to be used. Preferably, temperatures for selectively depositing copper by CVD range from 120° to 200° C. while temperatures for selectively depositing aluminum by CVD range from 100° to 145° C.

The resulting copper and aluminum layers can be thermally annealed to accelerate diffusion of copper into the aluminum thereby forming a homogeneous alloy. Suitable annealing temperatures may be limited by the thermal stability of the substrate or supporting structure. Suitable annealing temperatures for forming a homogeneous alloy can be readily determined by one of ordinary skill in the art.

Preferred temperatures for depositing copper using the complex with an olefin ligand are 110° to 190° C., and more preferably 130° to 180° C. Preferred temperatures for depositing copper using a complex formed with the silylolefin ligand range from 120° to 200° C. Typically, the aminealane compound to be contacted with the substrate is introduced into a carrier gas, preferably a carrier gas which is inert to the aminealane compound, such as argon, nitrogen, helium or hydrogen. Unlike prior art processes, the present invention is capable of depositing aluminum at relatively low temperatures and eliminates use of a corrosive activating agent such as titanium tetrachloride.

Additionally, the present process eliminates handling problems associated with pyrophoric liquid alkylaluminum compounds since the aminealanes used herein are nonpyrophoric solids. The instant process for selective depositing aluminum onto the substrate using a copper base layer results in an aluminum film which has a small grain size and which is generally free of carbon and oxygen impurities as confirmed by Auger electron spectroscopy. Since copper diffuses rapidly into aluminum, the selective CVD process of the present invention is capable of forming selectively deposited conformal copper aluminum alloys.

In forming the desired aluminum copper alloy, copper will diffuse into the aluminum film at a given temperature to a level which does not exceed the solid solubility limit of copper in aluminum at that given temperature. Therefore, increased copper concentrations within the aluminum layer can be achieved by rapidly thermally annealing the structure. The final amount of copper introduced into the aluminum copper alloy can be controlled by adjusting the relative thicknesses of the copper and aluminum films and by controlling the annealing conditions. The mechanism by which trimethylaminealane selectively deposits aluminum onto a patterned copper surface at very low temperatures is not fully understood. The mechanism for depositing aluminum onto clean aluminum surfaces using trimethylaminealane has been studied and the rate limiting step is initially associated with cleavage of the aluminum nitrogen bond.

The following examples are presented to illustrate the present invention and are not meant to be limiting.

EXAMPLES

The Examples set out below were carried out under the following general experimental procedures. A cold wall CVD reactor with two gas feed lines was used. In the first line trimethylaminealane was delivered to the reactor either under its own vapor pressure (ca. 2 torr at 25° C.) or was transported to the reactor via a carrier gas. Either hydrogen or argon was used as a carrier gas. Inert gases other than argon, such as nitrogen or helium, are also effective in practicing the disclosed process. The second feed line was either not used or used to carry an argon or hydrogen diluent gas. In most cases, the source was cooled to between 2° C. and 15° C. to prevent condensation of the organometallic precursor on the reactor walls and to decrease the delivery rate of trimethylaminealane. The reactor consisted of a four-way vacuum cross. The walls of the reactor were kept at room temperature during the runs of Examples 1-20.

Substrates to be coated were placed on a resistively heated stainless steel susceptor situated inside the reactor and the susceptor and substrate were raised to the desired deposition temperature by a resistive heater which was imbedded in the susceptor. Substrate temperature was measured with a thermocouple positioned such that the tip of the themocouple protruded slightly from the susceptor and was in contact with the substrate. Prior to running the experiment, the reactor was evacuated to a base pressure of $1^{-6}$ torr to minimize contamination of the growing film by adventitious water and oxygen.

Selective deposition was demonstrated by placing two different 4.5 mm $\times$ 20 mm coupons side by side on the susceptor such that they were in contact with each other and both directly below the stream of the incoming vapor feed. Selectivity was observed when there was a thick uniform coating on one substrate and little or no deposition on the other substrate. Three different pairs of substrates were used:

1. silicon oxide/copper
2. silicon oxide/titanium nitride
3. silicon oxide/tungsten The silicon oxide substrate consisted of a 180 angstrom thick oxide film thermally grown on a silicon (100) wafer. The titanium nitride substrate consisted of a silicon (100) wafer onto which a 550 angstrom layer of titanium nitride was deposited by reactive ion sputtering. The copper substrate consisted of a silicon (100) wafer onto which a 550 angstrom layer of titanium nitride was deposited by reactive ion sputtering. A 200 angstrom layer of copper was deposited thereafter by vacuum evaporation onto the titanium nitride. Titanium nitride is used as a diffusion barrier to prevent diffusion of copper and aluminum into the silicon wafer. The tungsten substrate consisted of a CVD tungsten film deposited onto a Si(100) wafer by the hydrogen reduction of tungsten hexafluoride.

Films were typically analyzed by scanning electron microscopy to determine the grain size and thickness of the aluminum film. In some cases, films were analyzed by Auger electron spectroscopy to determine the degree of copper interdiffusion into the aluminum and to determine the film purity. Common impurities in CVD aluminum films are carbon and oxygen. One film was also analyzed by time-of-flight secondary ion mass spectrometry to detect low levels of copper in an unannealed film.

EXAMPLE 1

Run 1 was carried out according to the general procedure set out above to selectively deposit an aluminum film onto a SiO$_2$/Cu substrate pair using vapors of trimethylaminealane. Hydrogen was used as a carrier gas and the deposition step was carried out at 110° C. A thin aluminum film was formed on the copper base layer whereas the silicon oxide substrate remained almost completely uncoated during the experiment. Detailed reaction conditions and results for Examples 1-20 are set out below in Tables 1 and 2 respectively.

EXAMPLE 2

Run 2 was conducted using conditions similar to those in Run 1 except a deposition temperature of 185° C. was used. No selectivity was observed (a thick uniform coating on both the copper and silicon oxide surfaces) and the film had a larger grain size than in Run 1. This illustrates the effect of temperature on both selectivity and grain size. Increased deposition temperature typically caused a loss of selectivity and resulted in a larger grain size in the film.

EXAMPLES 3 AND 4

Runs 3 and 4 were conducted without using a carrier gas. Reaction conditions were similar except for the deposition temperature. No selectivity was observed in Run 3 meaning that a uniform coating was created on both substrates. In Run 4 there was a uniform fine-grained coating on the copper substrate while no coating was observed on the silicon oxide substrate. A time-of-flight secondary ion mass spectrum (TOF SIMS) of the film deposited in Run 4 confirmed that some copper had diffused to the top surface of the aluminum film.

EXAMPLES 5 AND 6

In Runs 5 and 6 a titanium nitride surface was used instead of a copper surface. In neither case was deposition observed onto either the titanium nitride or the silicon oxide substrates when a deposition temperature of 110° C. was used. These Examples illustrate that while titanium nitride promotes the selective deposition of copper, such an effect is not observed in the case of aluminum. It is unclear whether this is a fundamental property of the titanium nitride layer or whether the lack of selectivity is due to an interfacial oxynitride layer which is common in titanium nitride films.

EXAMPLES 7 AND 8

The procedures of Runs 5 and 6 were repeated as Runs 7 and 8 except that a deposition temperature of 185° C. was used. In both Runs 7 and 8, blanket deposition was observed on the silicon oxide/titanium nitride surface.

EXAMPLES 9 AND 10

In Runs 9 and 10 a tungsten surface was used instead of a copper surface. In Run 9 the deposition temperature was 110° C. and no aluminum deposition was observed on either the tungsten or the silicon oxide. In Run 10 the deposition temperature was 185° C. and blanket deposition was observed on the substrate. These Examples illustrate that tungsten does not promote the selective deposition of aluminum as does copper.

EXAMPLE 11

Aluminum was deposited on a SiO$_2$/Cu substrate according to the general procedures presented herein. Immediately following deposition, reactor pressure was reduced to 3 torr and the hydrogen flow was maintained at 100 sccm. The sample was heated rapidly to 450° C. and annealed at that temperature for three minutes, then cooled rapidly to room temperature. A comparison of the Auger depth profile of this sample (Run 11) with the Auger depth profile of an unannealed sample (Run 4) shows that the thermal anneal caused copper to diffuse extensively into the aluminum film. This demonstrates the concept that a homogeneous alloy of aluminum and copper is fanned by first depositing a thin base layer of copper onto a diffusion barrier either by PVD or CVD techniques, then selectively depositing aluminum onto the copper layer using the process disclosed in this invention, then processing the structure with a rapid thermal anneal to form a homogeneous copper/aluminum alloy metallization.

EXAMPLES 12-20

Several Runs (12-20) were carried out according to the present invention to illustrate various reaction conditions for selectively depositing aluminum onto SiO$_2$/Cu substrates. The specific reaction conditions and results are set out in Tables 1 and 2. As can be seen from the Runs, deposition temperatures of 185° C. resulted in blanket deposition, and temperatures of 110° C. gave better selectivity results than Runs conducted at 145° C.

TABLE 1

SUMMARY OF DEPOSITION CONDITIONS

| Run No. | Substrate | Carrier Gas | Deposition Temp. (°C.) | Deposition Pressure (Torr) | Trimethyl-aminealane Source Temp. (°C.) | Deposition Time (min) | Flow Rate Carrier Gas (sccm) | Flow Rate Diluent Gas (sccm) |
|---|---|---|---|---|---|---|---|---|
| 1 | SiO$_2$/Cu | H$_2$ | 110 | 12 | 15 | 5 | 10 | 100 |
| 2 | SiO$_2$/Cu | H$_2$ | 185 | 12 | 5 | 15 | 10 | 100 |
| 3 | SiO$_2$/Cu | — | 185 | 0.4 | 25 | 3 | — | — |
| 4 | SiO$_2$/Cu | — | 100 | 0.3 | 2 | 10 | — | — |
| 5 | SiO$_2$/TiN | H$_2$ | 110 | 12 | 5 | 10 | 10 | 100 |
| 6 | SiO$_2$/TiN | — | 100 | 0.1 | 5 | 10 | — | — |
| 7 | SiO$_2$/TiN | H$_2$ | 185 | 12 | 2 | 10 | 10 | 100 |
| 8 | SiO$_2$/TiN | — | 185 | 0.1 | 5 | 10 | — | — |
| 9 | SiO$_2$W | H$_2$ | 110 | 13 | 2 | 10 | 10 | 100 |
| 10 | SiO$_2$/W | H$_2$ | 185 | 11 | 5 | 10 | 10 | 100 |
| 11* | SiO$_2$Cu | H$_2$ | 110 | 50 | 13 | 15 | 10 | 100 |
| 12 | SiO$_2$/Cu | H$_2$ | 145 | 20 | 15 | 10 | 10 | 100 |
| 13 | SiO$_2$/Cu | H$_2$ | 110 | 12 | 13 | 10 | 10 | 100 |
| 14 | SiO$_2$/Cu | H$_2$ | 110 | 12 | 7 | 15 | 10 | 100 |
| 15 | SiO$_2$/Cu | Ar | 110 | 12 | 10 | 15 | 10 | 100 |
| 16 | SiO$_2$/Cu | Ar | 185 | 12 | 4 | 10 | 10 | 100 |
| 17 | SiO$_2$/Cu | H$_2$ | 145 | 12 | 3 | 10 | 10 | 100 |
| 18 | SiO$_2$/Cu | Ar | 145 | 12 | 3 | 10 | 10 | 100 |
| 19 | SiO$_2$/Cu | — | 145 | 0.1 | 5 | 10 | — | — |
| 20 | SiO$_2$/Cu | — | 110 | 0.1 | 3 | 10 | — | — |

*Sample annealed in-situ at 450° C. for 3 minutes immediately following deposition.

TABLE 2
SUMMARY OF DEPOSITION RESULTS

| Run No. | Selectivity Towards | Grain Size (mm) | Film Thickness |
|---|---|---|---|
| 1 | Cu | 0.1–0.5 | 0.4 |
| 2 | Blanket | 1–3 | 1.0 |
| 3 | Blanket | 5–10 | |
| 4 | Cu | 0.1–0.5 | 0.8 |
| 5 | No Deposition | | |
| 6 | No Deposition | | |
| 7 | Blanket | 1–5 | |
| 8 | Blanket | 5–10 | |
| 9 | No Deposition | | |
| 10 | Blanket | 5–10 | |
| 11 | Cu | 0.1–0.5 | |
| 12 | Cu | 0.1–0.5 | |
| 13 | CU | 0.1–0.5 | |
| 14 | Cu/some selectivity loss | 0.1–0.5 | |
| 15 | Cu | 0.1–0.5 | |
| 16 | Blanket | | |
| 17 | Cu/partial coating on SiO₂ | 1–5 | |
| 18 | Cu | | |
| 19 | Cu/partial coating on SiO₂ | | |
| 20 | Cu | 0.1–0.5 | 0.4 |

An important trend is presented in the results presented in Tables 1 and 2. For the silicon oxide/copper substrate, all depositions carried out at 100°–110° C. resulted in selective deposition of aluminum onto copper. The selectivity observed at 100°–110° C. was independent of whether the organometallic was delivered with or without a carrier gas and whether the carrier gas was argon or hydrogen. Depositions carried out at 145° C. were sometimes selective but in some cases, partial coatings on the silicon oxide were observed. Depositions carried out at 185° C. all resulted in blanket deposition.

EXAMPLE 21

The run for this Example was conducted in a cold wall CVD reactor as described above. Two gas lines fed the reactor. In the first line the organometallic complex, either a betadiketonatocopper• (olefin) compound or an alkylaminealane, was delivered to the reactor under its own vapor pressure. Argon, nitrogen and helium are all effective carrier gases and could have been used. The second feed line was not used but could have been used to carry a diluent gas such as hydrogen, argon, nitrogen, or helium. The bubbler containing the organometallic complex was heated to a temperature at which a significant vapor pressure was observed. For the betadiketonatocopper• (olefin) complexes, such temperatures ranged from 40°–120° C. The alkylaminealane compounds exhibit sufficient volatility at room temperature and were not heated. The walls of the reactor were kept at a temperature equal to or higher than the bubbler temperature to prevent condensation of organometallic onto the reactor walls.

The substrate was a patterned tungsten fine line test circuit (FLTC) consisting of a serpentine pattern of tungsten deposited on the silicon portion of a patterned silicon/silicon oxide substrate. Tungsten is an example of a diffusion barrier between silicon and an aluminum-copper metanization. The tungsten lines are 2, 3, 4, and 5 microns wide in this circuit. Copper was deposited selectively onto the tungsten portion of the FLTC and no appreciable deposition was observed on the silicon oxide portion of the substrate. The copper precursor used was hexafluoroacetylacetonatocopper• (cycloctadiene). The deposition conditions for the copper CVD were as follows:

| | |
|---|---|
| Deposition Temperature | 150° C. |
| Bubbler Temperature | 112° C. |
| Pressure | 300 mtorr |
| Duration of Run | 37 minutes |
| Copper film thickness | 0.2 micron |

The now selectively copper coated FLTC was selectively metallized with aluminum using trimethylaminealane as the organometallic aluminum precursor. The deposition conditions for the selective aluminum CVD were as follows:

| | |
|---|---|
| Deposition Temperature | 110° C. |
| Bubbler Temperature | 20° C. |
| Pressure | 300 mtorr |
| Duration of Run | 10 minutes |
| Copper film thickness | 0.4 micron |

A cross-section backscattered scanning electron micrograph and a secondary scanning electron micrograph were made of the product FLTC. Three metal layers, tungsten, copper and aluminum, were apparent from the cross-sectional micrograph while the secondary micrograph clearly demonstrated that both the copper and aluminum depositions had occurred selectively on the tungsten and no deposition had occurred on the silicon oxide portion of the substrate. It was previously shown that under such conditions, copper will diffuse into the growing aluminum layer to the solid solubility limit of copper in aluminum at that temperature. Also, complete interdiffusion of copper into the aluminum can be achieved by a rapid thermal anneal of the copper/aluminum structure.

EXAMPLE 22

The run for this Example was conducted in a cold wall CVD reactor as described above. The substrate was a patterned tungsten fine line test circuit (FLTC) as described in Example 1 and hexafluoroacetylacetonatocopper(cyclooctadiene) was used as the copper precursor. Deposition conditions for forming the copper layer were:

| | |
|---|---|
| Deposition temperature: | 150° C. |
| Bubbler temperature | 40° C. |
| Pressure | 100 mtorr |
| Duration of Run | 30 minutes |
| Copper film thickness | 0.5 micron |

Copper was deposited selectively onto the tungsten portion of the FLTC with essentially no copper being deposited onto the silicon oxide portion of the substrate. The now selectively copper coated FLTC was selectively metallized with aluminum using trimethylaminealane as the organometallic aluminum precursor under the following conditions:

| | |
|---|---|
| Deposition temperature: | 110° C. |
| Bubbler temperature | 25° C. |
| Pressure | 300 mtorr |
| Duration of Run | 10 minutes |
| Aluminum film thickness | 0.5 micron |

Figure 1B:
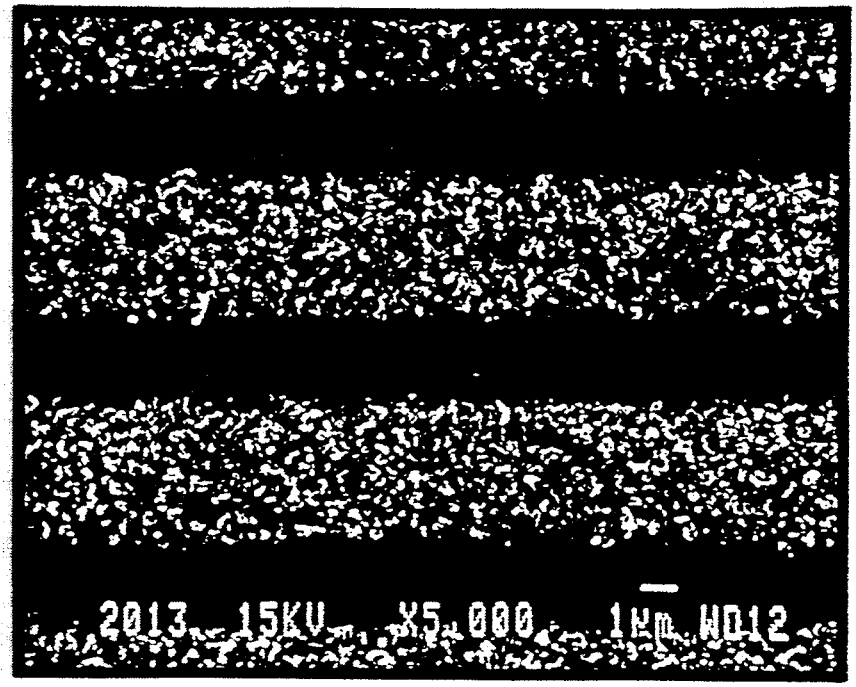
FIG. 1B illustrates a plane view scanning electron micrograph, presented in 5,000× magnification, of a patterned tungsten fine line test circuit onto which a layer of copper and aluminum has been selectively deposited.
Figure 2A:
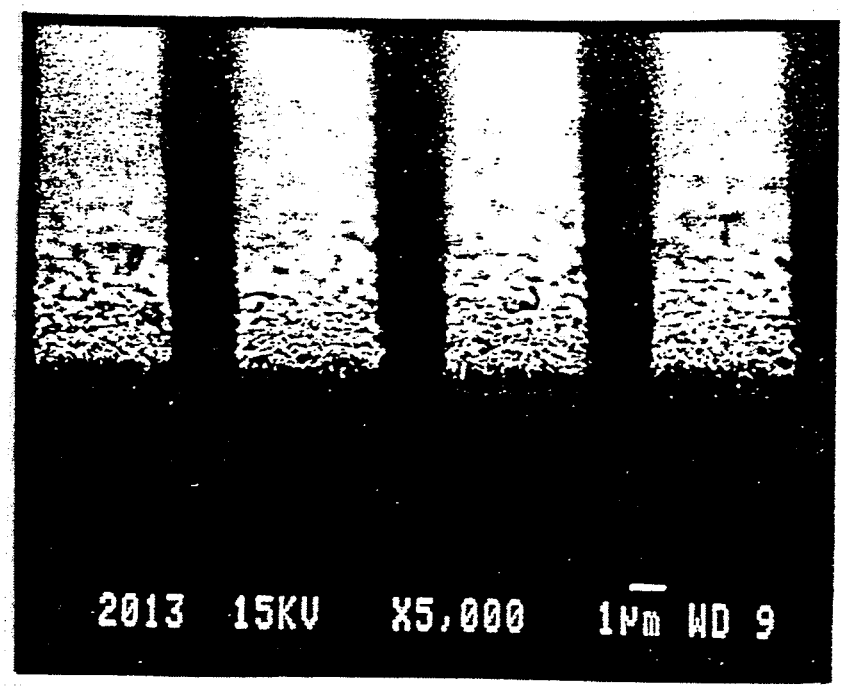
FIG. 2A illustrates a cross-sectional view scanning electron micrograph, presented in 5,000× magnification, of a patterned tungsten fine line test circuit onto which a layer of copper and aluminum has been selective deposited.
Figure 2B:
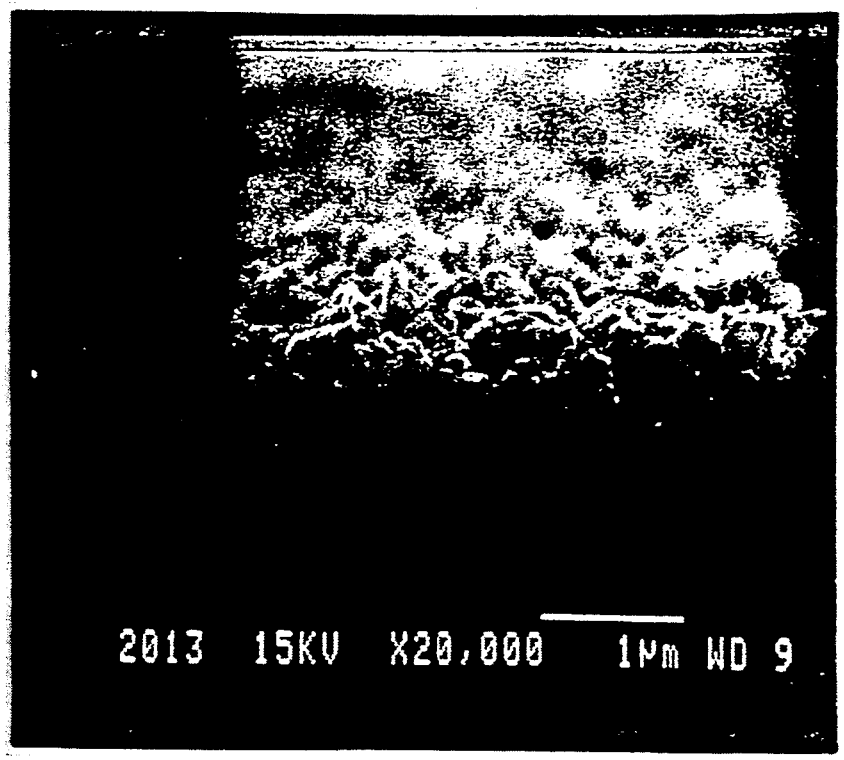
FIG. 2B illustrates a cross-sectional view scanning electron micrograph, presented in 20,000× magnification, of a patterned tungsten fine line test circuit onto which a layer of copper and aluminum has been selectively deposited.

A plane view scanning electron micrograph of the coated FLTC prepared according to this experiment is shown in FIG. 1 and a cross-sectional scanning electron micrograph of the material is shown in FIG. 2. As demonstrated in both views, excellent selectivity was achieved using the instant process. Both the copper and aluminum depositions occurred selectively on the tungsten and no metals were deposited onto the silicon oxide portion of the substrate.

Sequential CVD of copper and aluminum according to the invention provides a number of benefits. Most importantly, the process can operate entirely at temperatures at or below 200° C., thereby enabling the use of temperature sensitive substrates, such as polymers. These low operating temperatures are permitted without requiring a corrosive activating agent, such as titanium tetrachloride. Moreover, aluminum is selectively deposited without using liquid alkylaluminum compounds which are pyrophoric and difficult to handle. The instant process enables selective deposition of copper aluminum alloy in films which have small grain size and are essentially free of carbon and oxygen impurities as demonstrated by Auger electron spectroscopy. These alloy films conform to and selectively coat very small features.

Since copper diffuses readily into aluminum, the selective CVD process of this invention leads to formation of the desired copper aluminum alloy with a uniform distribution of copper in the aluminum film. Because copper also diffuses rapidly into silicon at low temperatures, it is important to have a diffusion barrier layer such as titanium nitride, tungsten, or other diffusion barrier which will prevent diffusion of copper into the silicon substrate. Finally, the copper CVD portion shows a strong selectivity to diffusion barrier surfaces.

Other advantages and features of the invention will be apparent to those skilled in the art from the foregoing disclosure, without departing from the spirit or scope of our invention.

We claim:

1. A process for selectively depositing aluminum onto a pattern of exposed silicon formed by coating a silicon substrate with an oxide layer and etching away a portion of the oxide layer to form the pattern of exposed silicon, which process comprises:
   (a) depositing a copper base layer on the pattern of exposed silicon to form a patterned copper base layer; and
   (b) selectively depositing aluminum onto the patterned copper base layer by contacting said base layer with vapors of an aminealane compound at a temperature from 25° to 180° C. to selectively deposit aluminum onto the patterned copper base layer portion of the substrate.

2. The process of claim 1 wherein said aminealane compound is trimethylaminealane.

3. The process of claim 1 wherein said copper base layer is deposited by chemical vapor deposition.

4. The process of claim 1 wherein said copper base layer is deposited by physical vapor deposition.

5. The process of claim 1 wherein the silicon substrate is contacted with vapors of an aminealane Compound at a temperature from 25° to 145° C.

6. The process of claim 5 wherein the silicon substrate is contacted with vapors of an aminealane compound at a temperature from 100° to 145° C.

7. The process of claim 6 wherein said aminealane compound is trimethylaminealane.

8. The process of claim 1 wherein said aminealane compound is present in a carrier gas.

9. The process of claim 8 wherein said carrier gas is argon or hydrogen.

10. The process of claim 1 wherein a diffusion barrier coating is applied to the exposed silicon portion of the substrate prior to depositing the copper.

11. The process of claim 10 wherein said diffusion barrier coating is selected from the group consisting of Ti, TiN, Ta, TaN, W and combinations thereof.

12. The process of claim 1 wherein the substrate undergoes annealing subsequent to the depositing of aluminum.

13. The process of claim 12 wherein said annealing is rapid thermal annealing.

14. The process of claim 10 wherein said copper base layer is deposited by chemical vapor deposition.

15. The process of claim 14 wherein said chemical vapor deposition is effected using an organometallic copper complex comprising a copper (I) per-fluoroalkyl-$\beta$-diketonate and an olefin or a silylolefin at a temperature at or below 200° C.

16. A process for selectively depositing a copper aluminum alloy on a metallic surface or electrically conducting surface which comprises
   (a) contacting said surface with an organometallic complex of copper (I) perfluoroalkyl-$\beta$-diketonate and olefin or silylolefin under chemical vapor deposition conditions including a temperature at or below 200° C. to form a copper layer on said surface,
   (b) contacting said copper layer with a base adduct of alane under chemical vapor deposition conditions including a temperature in the range of 25° to 180° C. to deposit aluminum on said copper layer, and
   (c) during or subsequent to step (b) subjecting said copper layer and deposited aluminum to a temperature which promotes migration of copper ions into said aluminum to form said alloy.

17. The process of claim 16 wherein step (a) is carried out at a temperature in the range of 120° to 200° C. and step (b) is carried out at a temperature in the range of 100° to 145° C.

18. The process of claim 16 wherein said metallic surface or other electrically conducting surface is a patterned diffusion barrier.

19. The process of claim 16 wherein said base adduct of alane is an aminealane.

20. The process of claim 19 wherein said aminealane is trimethylaminealane.

21. The process of claim 16 wherein said copper (I) perfluoroalkyl-$\beta$-diketonate is complexed with an olefin.

22. The process of claim 21 wherein said complex formed form said copper (I) perfluoroalkyl-$\beta$-diketonate and said olefin is $Cu^{+1}$ (hexafluoroacetylacetonate)$^{-1}$.

23. The process of claim 22 wherein said olefin is 1,5-cyclooctadiene.

24. The process of claim 22 wherein said olefin is norbornadiene.

25. The process of claim 16 wherein said organometallic copper complex is $Cu^{+1}$ (hexafluoroacetylacetonate)$^{-1}$ • trimethylvinylsilane.

26. The process of claim 16 wherein said organometallic copper complex is represented by the structural formula:

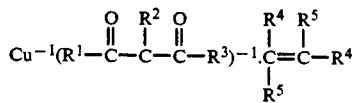

wherein

R$^1$ and R$^3$ are each independently C$_1$ to C$_8$ perfluoroalkyl,

R$^2$ is H, F or C$_1$ to C$_8$ perfluoroalkyl, each R$^4$ is independently H, C$_1$ to C$_8$ alkyl or —Si(R$^6$)$_3$, each R$^5$ is independently H, C$_1$ to C$_8$ alkyl or alkenyl or phenyl or both R$^5$ groups can be joined in a cycloolefin, and each R$^6$ is independently phenyl or C$_1$ to C$_8$ alkyl, including both cis and trans isomers thereof.

27. The process of claim 26 wherein at least one R$^4$ is —Si(R$^6$)$_3$ and each R$^5$ is H or C$_1$-C$_8$ alkyl.

* * * * *